United States Patent [19]

Askew et al.

[11] Patent Number: 5,070,070

[45] Date of Patent: Dec. 3, 1991

[54] HIGH TEMPERATURE SUPERCONDUCTING MEMORY STORAGE DEVICE AND CRYOTRON

[75] Inventors: Thomas R. Askew; Richard B. Flippen, both of Wilmington; Munirpallam A. Subramanian, New Castle, all of Del.

[73] Assignee: E. I. Du Pont de Nemours and Company, Wilmington, Del.

[21] Appl. No.: 165,683

[22] Filed: Mar. 9, 1988

[51] Int. Cl.$^5$ .................... H01L 39/12; H01L 39/18; G11C 11/44
[52] U.S. Cl. ......................... 505/1; 505/701; 505/782; 365/160; 365/161; 307/245; 307/277; 307/306
[58] Field of Search ............... 365/160, 161; 505/1, 505/701, 782; 307/591, 295, 277, 306

[56] References Cited

U.S. PATENT DOCUMENTS 4,164,030  8/1979  Kupriyanov et al. ............... 365/162

OTHER PUBLICATIONS

Michel et al., Zeitschrift fur Physik B-Condensed Matter 68, 421-423 (1987).
Maeda et al., Japanese Journal of Applied Physics 27, 209-210 (1988).
Subramanian et al, "A New High Temperature Supeconductor: $Bi_2Sr_{3-x}Ca_xCu_2O_{8+y}$", Science, Feb. 26, 1988, pp. 1015-1017.
Brus, "Superconductivity—A Revolution Beckons in Microelectronics", Microwaves & RF, Jul. 1987, pp. 35-43.
Polturak et al, Physical Review, B, No. 36, Oct. 1987, pp. 5586-5587.

Primary Examiner—Glenn Gossage

[57] ABSTRACT

Binary memory storage devices and cryotrons utilizing superconducting crystals exhibiting an onset of superconductivity and a relatively weak flux exclusion at a temperature T1 and the onset of relatively strong flux exclusion at T2, where T1>T2>77K, are controlled by dc magnetic fields. The preferred superconducting crystals have the formula $Bi_2Sr_{3-z}Ca_zCu_2O_{8+w}$ wherein z is from about 0.1 to about 0.9 and w is greater than zero but less than about 1.

4 Claims, 3 Drawing Sheets

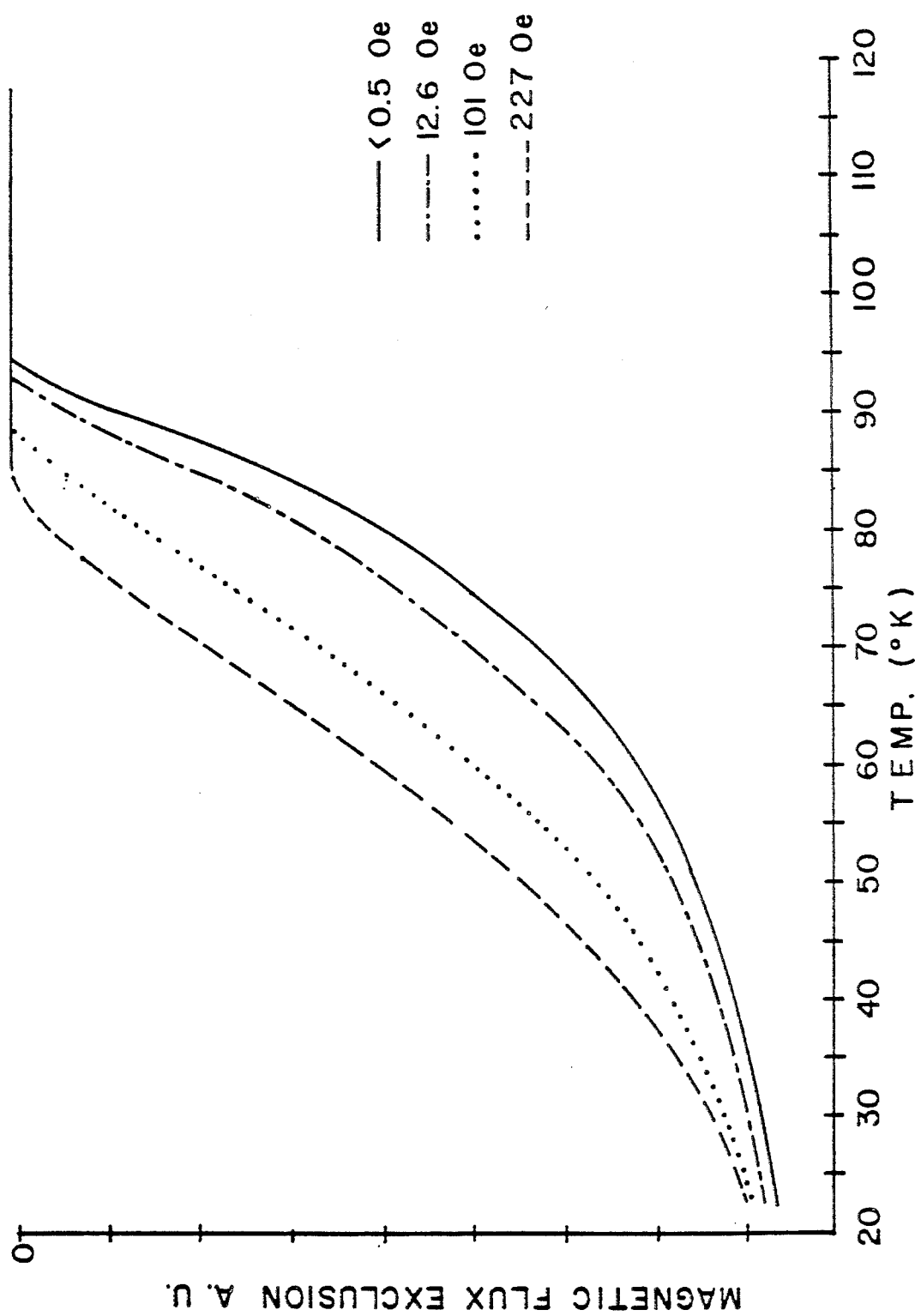

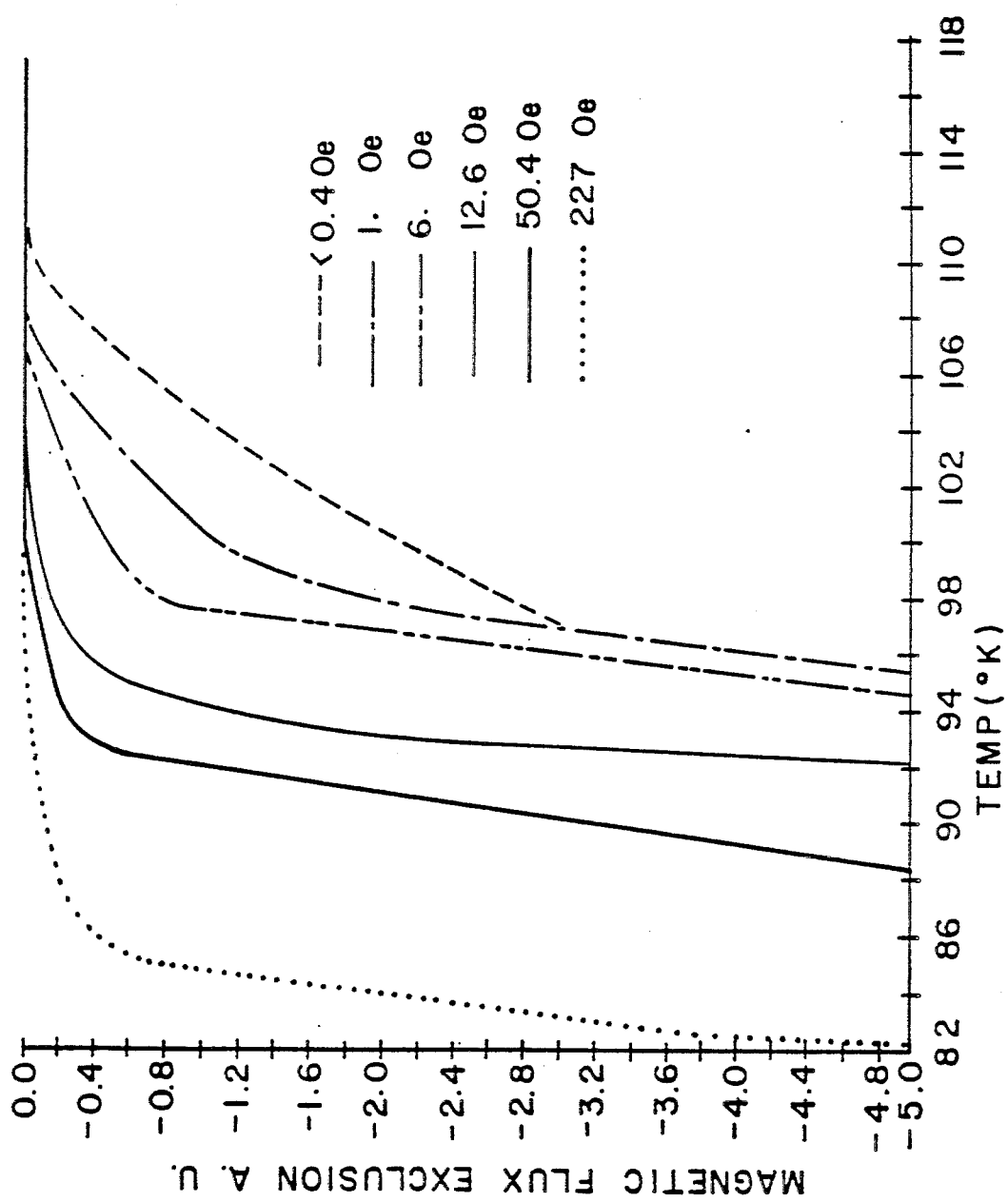

1

HIGH TEMPERATURE SUPERCONDUCTING MEMORY STORAGE DEVICE AND CRYOTRON

BACKGROUND OF THE INVENTION

1. Field of the Invention

This invention relates to the use of the magnetic flux exclusion in certain superconducting compositions for the operation of cryotrons and magnetic storage devices.

2. Background

Magnetic storage devices rely on large numbers of bistable elements to store information. The two stable states of each element correspond to the two logical states of the binary memory storage device, e.g., "zero" and "one". Heretofore, magnetic storage devices have utilized various semiconductor devices involving integrated circuit elements or various magnetic devices involving materials such as magnetic cores and/or magnetic thin films.

The cryotron is a device that performs some of the functions of an electron tube and utilizes the fact that a changing magnetic field can cause a superconductive element to oscillate between a state of low and high resistance. By imposing the magnetic field resulting from a current passing through a control element on the superconductive element, the latter can be switched from its superconducting state to its normal state. As a result, the current in the superconductor can be periodically eliminated or restored and the absence or presence of the current can correspond to the two logical states of the binary memory cell.

However, it should be noted that none of these devices of the prior art utilizes the magnitude of the magnetic flux exclusion of a superconducting composition as a measure of the logical state of the element. Furthermore, none of the superconducting compositions of the prior art could be employed in such devices at temperatures above 77K (liquid nitrogen).

BRIEF DESCRIPTION OF THE DRAWINGS

The Drawing consists of five figures. FIGS. 1, 2 and 3 show flux exclusion vs. temperature behavior of the crystals of the present invention. FIG. 4 shows a binary memory storage device. FIG. 5 shows a cryotron.

SUMMARY OF THE INVENTION

Figure 1:
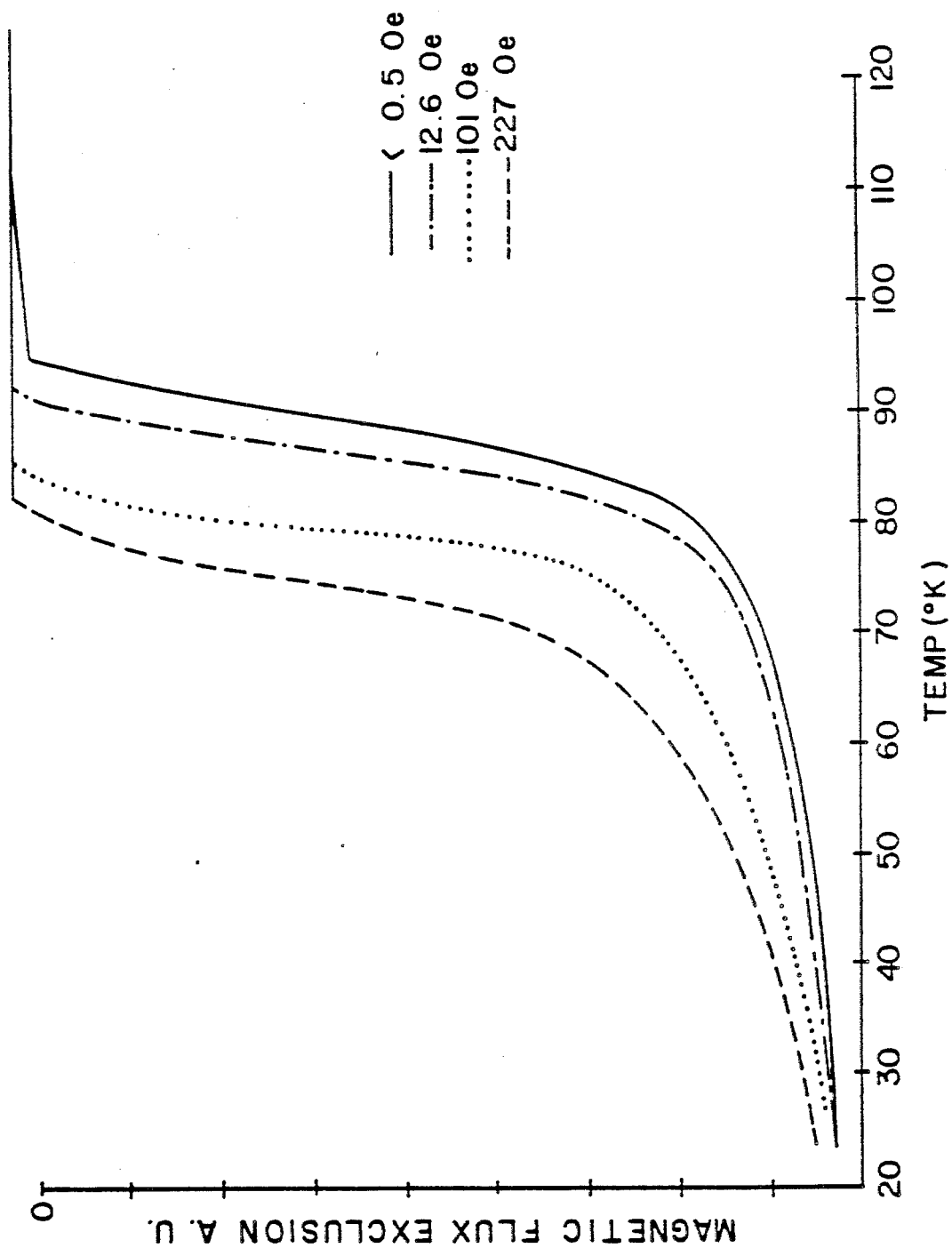

This invention provides novel devices based on the use of DC magnetic fields to control the magnetic flux exclusion of, or the current flowing through, certain superconductive crystals. Specifically, the invention involves binary memory storage devices and cryotrons that utilize certain superconductive crystals as set forth in this specification.

The superconductive crystals of this invention are characterized by their ability to exhibit the onset of superconductivity and the onset of a relatively weak flux exclusion at a temperature, $T_1$, and the onset of a relatively strong flux exclusion at a temperature, $T_2$, where $T_1$ is greater than $T_2$ and $T_2$ is greater than the temperature of liquid nitrogen, 77K. At 77K, the crystal exhibits an even stronger flux exclusion.

It has been found that the superconductive crystals isolated from the compositions described in commonly assigned application Ser. Nos. 07/152,186, filed Feb. 4, 1988 and 07/528,270, which is a continuation of 07/153,107, now abandoned, filed Feb. 8, 1988, are particulary desirable. Specifically, these crystals have the formula $Bi_2Sr_{3-z}Ca_zCu_2O_{8+w}$ wherein "z" is from about 0.1 to about 0.9, preferably 0.4 to 0.8, and "w" is greater than zero but less than about 1. This crystal has a structure based on an A-centered orthorhombic cell with a=5.409Å, b=5.414Å. This crystal exhibits the onset of superconductivity and, in the presence of a dc magnetic field, weak flux exclusion at a temperature $T_1$ of at least 95K., and the onset of strong flux exclusion at a temperature $T_2$ of at least 85K. By cooling the crystal to a temperature between 77K and $T_2$ and applying the dc magnetic field, the temperature of the onset of strong flux exclusion can be further reduced.

In one aspect, the present invention is a binary memory storage device comprising at least one crystal exhibiting the onset of superconductivity and weak flux exclusion at a temperature $T_1$ and the onset of strong flux exclusion at a temperature $T_2$ where $T_1 > T_2 > 77K$; means to cool each said crystal to a temperature between $T_2$ and $T_1$; means to independently apply a dc magnetic field of at least about 1 Oe (80 A/m), preferably about 5 Oe (400 A/m) or more, perpendicular to the basal plane of each said crystal to greatly reduce the excluded flux and to remove said dc magnetic field to restore the excluded flux to its original magnitude; means to independently detect the amount of flux excluded by each said crystal, each crystal serving as a data bit with the existence of either a large excluded flux or a small excluded flux by each said crystal being the measure of the logical state of each said crystal.

In another aspect the present invention is a binary memory storage device comprising at least one crystal exhibiting the onset of superconductivity and weak flux exclusion at a temperature $T_1$ and the onset of strong flux exclusion at a temperature $T_2$ where $T_1 > T_2 > 77K$; means to cool said crystal to a temperature between 77K and $T_2$; means to independently apply a dc magnetic field of at least about 10 Oe (800 A/m), preferably at least about 30 Oe (2400 A/m), to each crystal present to greatly reduce the excluded flux and to remove said dc magnetic field to restore the excluded flux to its original magnitude; and means to independently detect the amount of flux excluded by each crystal, each crystal serving as a data bit with the existence of either a large excluded flux or a small excluded flux by the crystal being the measure of the logical state of each said crystal.

In another aspect, the present invention is an improved cryotron comprising means to pass a current through an element that exhibits superconductivity and means to cool said element to a temperature below its superconducting transition temperature, the improvement involving using as the element a crystal exhibiting the onset of superconductivity and weak flux exclusion at a temperature $T_1$ and the onset of strong flux exclusion at a temperature $T_2$ where $T_1 > T_2 > 77K$; cooling said crystal to a temperature between $T_2$ and $T_1$; applying a dc magnetic field of at least about 1 Oe (80 A/m), preferably about 5 Oe (400 A/m) or more, perpendicular to the basal plane of the crystal to greatly reduce the current carried by the crystal and removing said dc magnetic field to restore the current carried by the crystal to its original magnitude.

In another aspect, the present invention is an improved cryotron comprising means to pass a current through an element that exhibits superconductivity and means to cool said element to a temperature below its superconducting transition temperature, the improvement involving using as the element a crystal exhibiting the onset of superconductivity and weak flux exclusion at a temperature $T_1$ and the onset of strong flux exclusion at a temperature $T_2$ where $T_1 > T_2 > 77K$; cooling said crystal to a temperature between 77K and $T_2$, applying a dc magnetic field of at least about 10 Oe (800 A/m), preferably at least about 30 Oe (2400 A/m), to the crystal to greatly reduce the current carried by the crystal and removing said dc magnetic field to restore the current carried by the crystal to its original magnitude.

DETAILED DESCRIPTION OF THE INVENTION

The Bi—Sr—Ca—Cu oxide crystals used in the methods and devices of this invention can be prepared by the following process. Compositions having the nominal formula $Bi_aSr_bCa_cCu_3O_x$, wherein a is from about 3/2 to about 3, b is from about 3/2 to about 4, c is from about 1/2 to about 3/2 and $x=(1.5a+b+c+y)$ where y is from about 2 to about 5, with the proviso that b + c is about 3–5 are prepared by mixing, for example, by grinding them together in a mortar stoichiometric quantities of $Bi_2O_3$, SrO or $SrO_2$, CaO, and CuO. Precursors of the oxides such as carbonates can be substituted for one or more of the oxides. Alternatively, an intimate stoichiometric mixture of precursors of the oxides can be prepared from a solution of precursors such as nitrates or acetates, either by precipitation from such a solution or by drying such a solution by evaporation of the solvent or by spray- or freeze-drying. The mixture of oxides or precursors in the form of a powder or a pressed pellet is then placed in a container made of a non-reactive material such as alumina or gold. A powder form is preferred since this yields more useable single crystals in the product. The container is then placed in a furnace and heated at about 775° C. to about 900° C. for about 8 to about 48 hours in air, preferably from about 850° C. tq about 900° C. The superconducting transition temperature is generally higher if the heating temperature is in the preferred range. Melting should be avoided. Since melting occurs at heating temperatures of about 900° C. and higher, the reaction should take place below these temperatures.

Cooling can be done slowly by either turning off the power to the furnace and allowing the container to furnace-cool or by programming the furnace to cool at a slow rate, e.g., at 2° C. per minute. When the temperature is below 100° C., e.g. ambient temperature (about 20° C.) the container is removed from the furnace and the black crystalline product is recovered. Cooling can also be accomplished by quenching at ambient temperature the material which had been heated to 850–900° C. Slower cooling increases the yield of useable crystals and is therefore preferred.

The black plate-like crystals used in this invention are readily separated from the remainder of the product. The crystals prepared in this manner have the formula $Bi_2Sr_{3-z}Ca_zCu_2O_{8+w}$ wherein z is from about 0.1 to about 0.9, preferably from about 0.4 to about 0.8, and w is greater than 0 but less than about 1.

Superconductivity can be confirmed by observing magnetic flux exclusion which is related to the Meissner effect. This effect can be measured by the ac inductance method described in an article by E. Polturak and B. Fisher in Physical Review B, 36, 5586(1987). The crystalline sample is placed in a capillary tube which is placed in one secondary of a small mutual inductance coil set. The common primary of the coil set is driven by a 100–10,000 Hz applied voltage and produces an alternating magnetic field of maximum strength of about 1 Oe (80 A/m). This alternating magnetic field produces a null signal from the matched and opposed secondary coils in the absence of flux exclusion from the sample. The magnitude of the secondary signal is proportional to the amount of flux excluded from the sample.

The crystals used in this invention have been found to exhibit weak flux exclusion between the temperature of onset of superconductivity, i.e., temperature $T_1$ which has generally been found to be greater than 100K. for the preferred crystals, and $T_2$ which has generally been found to be greater than about 85K., usually about 95K. There is a much stronger flux exclusion as the crystals are cooled below $T_2$. The flux exclusion of these crystals can be controlled and varied by exposing the crystal to a small dc magnetic field. As used herein both $T_1$ and $T_2$ are the respective onset temperatures determined with no applied dc magnetic field.

When the temperature of the crystal is between about $T_2$ and $T_1$, i.e., in the weak flux exclusion temperature range, a dc magnetic field of at least about 1 Oe (80 A/m) applied perpendicular to the basal plane of the plate-like crystals greatly reduces the excluded flux. Use of dc magnetic fields of 5 to 15 Oe (400 to 1200 A/m) result in even more drastic reductions in the excluded flux. The excluded flux is essentially "zero" when the dc magnetic has a magnitude of about 15 Oe (1200 A/m). While higher magnetic fields may be used there is little to be gained in the way of further decrease in the excluded flux.

This invention provides a method to control the magnitude of the flux exclusion in Bi—Sr—Ca—Cu oxide crystals exhibiting the onset of superconductivity and weak flux exclusion at a temperature $T_1$ and the onset of strong flux exclusion at a temperature $T_2$ where $T_1 > T_2 > 77K$, the method comprising cooling one or more said Bi—Sr—Ca—Cu oxide crystals to a temperature between $T_2$ and $T_1$, preferably at a temperature closer to $T_2$ than $T_1$, and applying a dc magnetic field of at least about 1 Oe (80 A/m), preferably about 5 Oe (400 A/m) or more, to greatly reduce the excluded flux and removing said magnetic field to restore the excluded flux to its original magnitude, said magnetic field applied perpendicular to the basal plane of said crystals. It is preferred to cool said crystals to a temperature closer to $T_2$ than to $T_1$ since this results in a larger reduction in excluded flux for a given dc magnetic field strength.

The Bi—Sr—Ca—Cu oxide crystals can be cooled to a temperature between $T_2$ and $T_1$ by placing the crystals in a region cooled by liquid nitrogen, for example, by placing the crystals in a container which is then immersed into a Dewar flask containing liquid nitrogen, and using a heating coil to achieve the desired temperature. The dc magnetic field can be supplied by a solenoid or coil to which is applied a constant voltage. At a given temperature, the magnitude of the excluded flux in a crystal can be determined, without affecting the amount of flux excluded, by using a weak alternating magnetic inductance technique as described above.

The presence or absence of flux exclusion, i.e., a relatively large amount of excluded flux as compared to a relatively small or essentially zero excluded flux, can serve as a data "bit" in a digital data storage system. In a magnetic storage device, an array of the crystals are maintained at a temperature between $T_2$ and $T_1$. A coil or solenoid or other means supplies a dc magnetic field at each crystal element in the array and means are provided to detect the flux excluded by each element in the array. Each crystal element in the array can be comprised of one or more stacked crystals. Such an array provides a read in/read out memory or storage device.

Therefore, this invention also provides a memory storage device comprised of one or more Bi—Sr—Ca—Cu oxide crystals exhibiting the onset of superconductivity and weak flux exclusion at a temperature $T_1$ and the onset of strong flux exclusion at a temperature $T_2$ where $T_1 > T_2 > 77K$. Means are provided to cool the Bi—Sr—Ca—Cu oxide crystals to a temperature between $T_2$ and $T_1$; and means are also provided to independently apply and remove a dc magnetic field of at least about 1 Oe (80 A/m), preferably at least about 5 Oe (400 A/m), perpendicular to the basal plane of each Bi—Sr—Ca—Cu oxide crystal present; and, finally, means are provided to independently detect the amount of flux excluded by each Bi—Sr—Ca—Cu oxide crystal present.

When the temperature of the crystal is between about 77K and about $T_2$, i.e., within the stronger flux exclusion temperature range, a dc magnetic field can greatly reduce the excluded flux by lowering the temperature at which the stronger flux exclusion begins. The shift in the temperature at which the beginning of stronger flux exclusion occurs depends on the magnitude of the dc magnetic field applied. The rate of shift is greater for fields below about 30 Oe (2400 A/m), about 0.2 degrees K per Oe, and smaller for fields greater than about 30 Oe (2400 A/m), about 15 0.02 degrees K per Oe. When the crystals are maintained at a temperature close to $T_2$, typically about 95K, application of a dc magnetic field as low as 10 Oe (800 A/m) will result in a marked decrease in the excluded flux. As the temperature at which the crystals are maintained is lowered, larger magnetic fields are needed to cause similar changes in the magnitude of the excluded flux. When the crystals are maintained at a temperature close to 77K, application of a magnetic field of 100 to 200 Oe (8000 to 16000 A/m) is needed. Higher magnetic fields may be used but there is little to be gained in the way of further decrease in the excluded flux by using magnetic fields in excess of 200 Oe (16000 A/m). Temperatures lower than 77K are also operable, again with higher magnetic fields. However, 77K has been indicated as a lower temperature limit because of the advantage of operating at or above the temperature of liquid nitrogen.

This invention also provides a second method to control the magnitude of the flux exclusion in Bi—Sr—Ca—Cu oxide crystals exhibiting the onset of superconductivity and weak flux exclusion at a temperature $T_1$ and the onset of strong flux exclusion at a temperature $T_2$ where $T_1 > T_2 > 77K$. This method comprising cooling one or more of said Bi—Sr—Ca—Cu oxide crystals to a temperature between about 77K and $T_2$ and applying a constant magnetic field of at least about 10 Oe (800 A/m), preferably at least about 30 Oe (2400 A/m), to shift the temperature of onset of strong flux exclusion to a lower temperature to thereby greatly reduce the excluded flux Then, by removing the magnetic field, the temperature of onset of strong flux exclusion is restored to $T_2$ thereby restoring the excluded flux to its original magnitude.

The Bi—Sr—Ca—Cu oxide crystals can be cooled to a temperature between about 77K and $T_2$ by placing the crystals in a region cooled by liquid nitrogen. For example, by placing the crystals in a container which is then immersed into a Dewar flask containing liquid nitrogen, and then using a heating coil, the desired temperature can be achieved. As before, the constant magnetic field can be supplied by solenoids or coils to which are applied a constant voltage. At a given temperature, the presence or absence of the excluded flux in a crystal is determined without affecting the amount of flux excluded by using a weak alternating magnetic inductance technique as described above, a SQUID magnetometer or a semiconductor magnetic field sensor based on the Hall effect.

Hence, this invention also provides a second memory storage device comprised of one or more Bi—Sr—Ca—Cu oxide crystals exhibiting the onset of superconductivity and weak flux exclusion at a temperature $T_1$ and the onset of strong flux exclusion at a temperature $T_2$ where $T_1 > T_2 > 77K$, means to cool said Bi—Sr—Ca—Cu oxide crystals to a temperature between about 77K and $T_2$, means to independently apply and remove a constant magnetic field of at least about 10 Oe (800 A/m), preferably at least about 30 Oe (2400 A/m), to each Bi—Sr—Ca—Cu oxide crystal present and means to independently detect the amount of flux excluded by each Bi—Sr—Ca—Cu oxide crystal present.

FIG. 4 is a schematic drawing of a binary memory storage device of the invention. The superconducting Bi—Sr—Ca—Cu—O crystal 1 is shown in a Dewar flask 2 containing liquid nitrogen. A resistive heating coil 3 is connected to a seat of electromotive force (Emf) 4 and can be used to raise the temperature above 77K. The combination of elements 2, 3 and 4 constitutes the means to cool the crystal to a temperature between about 77K and about 96K. A solenoid 5, which is shown with a portion removed to show the superconducting crystal 1 inside the solenoid, is connected and disconnected to a seat of electromotive force (Emf) 6 by means of a switch 7, with the number of turns of wire in the solenoid and the current provided by the Emf chosen to result in a dc magnetic field of the desired magnitude. The combination of elements 5, 6 and 7 with the connection wires constitutes the means to apply a dc magnetic field of about 10 Oe (800 A/m) to about 200 Oe (16000 A/m) to the crystal to reduce the excluded flux and to remove said dc magnetic field to restore the excluded flux to its original magnitude. One secondary coil 8 of a mutual induction coil set is placed around the superconducting crystal and the second coil 9 of the matched pair of secondary coils is connected to the first so that signals generated in the two coils by a magnetic field generated by a voltage applied to the primary coil of the coil set would oppose. When the primary is driven by a 100–10,000 Hz applied voltage and produces an alternating magnetic field of maximum strength of about 1 Oe (80 A/m), this alternating magnetic field produces a null signal from the matched and opposed secondary coils in the absence of flux exclusion and a signal proportional to the amount of flux exclusion and a signal proportional to the amount of flux excluded when there is flux exclusion. The primary coil of the coil set is not shown in order to not overly complicate the figure.

In all of the above methods and devices it is preferable that the Bi—Sr—Ca—Cu oxide has the formula $Bi_2Sr_{3-z}Ca_zO_{8+w}$ wherein z is from about 0.1 to about 0.9 and w is greater than zero but less than about 1. Most preferably, z is from about 0.4 to about 0.8.

As detailed above, the flux exclusion of these superconductive crystals can be controlled and varied by exposing the crystals to a small dc magnetic field. In a similar manner, if a voltage were applied across a crystal to produce a current through it, the magnitude of the current can be controlled and varied by exposing the crystal to a small dc magnetic field.

When the temperature of the crystal is between about $T_2$ and $T_2'$, i.e., in the weak flux exclusion temperature range, a dc magnetic field of at least about 1 Oe (80 A/m) applied perpendicular to the basal plane of the plate-like crystal would greatly reduce the crystal current.

When the temperature of the crystal is between about 77K and about $T_2$, i.e., within the stronger flux exclusion temperature range, a dc magnetic field of at least about 10 Oe (800 A/m) would greatly reduce the crystal current by lowering the temperature at which the stronger flux exclusion begins.

The control of the current by an imposed magnetic field is the basis of cryotron operation. The advantages of the use of these crystals in cryotrons, as indicated previously, are the ability to operate at a temperature equal to or above the temperature of liquid nitrogen, 77K, and the ability to control the current with small magnetic fields which arises from the sensitivity of the superconducting properties of these crystals to magnetic fields.

FIG. 5 is a schematic drawing of a cryotron of the invention. The superconducting Bi—Sr—Ca—Cu—O crystal 1 is shown in a Dewar flask 2 containing liquid nitrogen. A resistive heating coil 3 is connected to a seat of electromotive force (Emf) 4 and can be used to raise the temperature above 77K. The combination of elements 2, 3 and 4 constitutes the means to cool the crystal to a temperature between about 77K and about 96K. A solenoid 5, which is shown with a portion removed to show the superconducting crystal 1 inside the solenoid, is connected and disconnected to a seat of electromotive force (Emf) 6 by means of a switch 7, with the number of turns of wire in the solenoid and the current provided by the Emf chosen to result in a dc magnetic field of the desired magnitude. The combination of elements 5, 6 and 7 with the connection wires constitutes the means to apply a dc magnetic field of about 10 Oe (800 A/m) to about 200 Oe (16000 A/m) to the crystal to reduce the excluded flux and to remove said dc magnetic field to restore the excluded flux to its original magnitude. A seat of Emf 8 and the wires connecting it to the crystal are the means to pass a current through the crystal.

EXAMPLE OF THE INVENTION $Bi_2O_3$ (9.3192 g), $SrO_2$ (2.00184 g), $CaCO_3$ (4.7848 g) and CuO (4.7724 g) were mixed and ground together in an agate mortar for thirty minutes. The powder mixture was placed in a gold crucible and the crucible placed in a furnace and heated in air at a rate of 10° C. per minute to 875° C. and then held at 875° C. for 36 hours. The furnace was then cooled at the rate of 2° C. per minute to a temperature of 250° C. The sample was then allowed to cool to room temperature (about 20° C.) in the furnace and the crucible was then removed. Black plate-like crystals were predominant in the product and these were mechanically separated from the rest of the product and used in the instant invention.

Flux exclusion was measured using the ac inductance technique previously described. A non-inductively wound heater coil surrounds the mutual induction coil set and all of this is surrounded by a long solenoid which is used to generate a dc magnetic field parallel to the alternating magnetic field generated by the primary coil. The coils and solenoid are contained within a 0.5 inch diameter stainless steel tube which can be placed inside a standard liquid helium storage Dewar flask to reach cryogenic temperatures. The sample temperature is measured with a calibrated Si diode sensor mounted adjacent to the capillary tube that contains the sample. The sensor and the heater coil form part of a digital closed loop thermal control system which has an observed characteristic response time of about 9 sec.

Some of the small (0.05–0.1 mm size) plate-like crystals were used to prepare two samples. A stack of 20–30 crystals was loaded in a capillary tube with the basal planes of the crystals perpendicular to the axis of the tube and therefore, perpendicular to the dc magnetic field that is applied in the apparatus. A similar number of crystals was placed in a tube with the basal planes of the crystals parallel to the axis of the tube and, therefore, parallel to the dc magnetic field that is applied in the apparatus. Results were obtained with both samples by first cooling each to low temperatures, i.e., below 30K, in the apparatus to perform the flux exclusion measurements and, thereafter, using the heater to cycle the temperature above and below the transition temperature. Flux exclusion was first measured with zero magnetic field, then the temperature was raised well above the transition temperature. A dc magnetic field was then applied and the sample cooled in the field to low temperatures. This was repeated for various magnitudes of the magnetic field. The background magnetic field in the apparatus was measured and found to be less than 0.5 Oe (40 A/m).

Results of the flux exclusion measurements are shown in FIG. 1 for the magnetic field perpendicular to the basal planes and in FIG. 2 for the magnetic field parallel to the basal planes case. The weak exclusion region for the perpendicular case is shown in an expanded scale in FIG. 3.

From FIG. 3, it can be seen that when the temperature of the crystal is between about 96K and 116K, the temperature of the onset of superconductivity (i.e., when the temperature is within the weak flux exclusion temperature range) a dc magnetic field of at least about 1 Oe (80 A/m) applied perpendicular to the basal plane of the plate-like crystals greatly reduces the excluded flux. The use of dc magnetic fields of 5 (400 A/m) to 15 Oe (1200 A/m) results in even more drastic reductions in the excluded flux; and the excluded flux is essentially zero when the dc magnetic field has a magnitude of about 15 Oe (1200 A/m).

From FIGS. 1 and 2 it can be seen that when the temperature of the crystal is between about 77K and about 96K, i.e., when the temperature is within the stronger flux exclusion temperature range, a dc magnetic field can greatly reduce the excluded flux by lowering the temperature at which the stronger flux exclusion begins. When the crystals are maintained at a temperature close to 96K, application of a dc magnetic field as low as 10 Oe (800 A/m) will result in a marked decrease in the excluded flux. As the temperature at which the crystals are maintained is lowered, larger magnetic fields are needed to cause similar changes in the magnitude of the excluded flux. When the crystals are maintained at a temperature close to 77K, application of a magnetic field of 100 to 200 Oe (8000 A/m to 16000 A/m) is required.

The invention is not limited to the exact details presented in the foregoing description. Obvious modifications will occur to one skilled in the art.

The invention being claimed is:

1. A binary memory storage device comprising a crystal of a compound having the formula $$Bi_2Sr_{3-z}Ca_zCu_2O_{8+w}$$

wherein z is from about 0.4 to about 0.8 and $o<w<1$, means for cooling said crystal to a temperature between about 77K and about 96K, means for applying and removing a dc magnetic field of about 10 Oe (800 A/m) to about 200 Oe to said crystal, means for applying an alternating magnetic field having a maximum strength of about 1 Oe to said crystal, and means for detecting the amount of flux excluded by said crystal.

2. The binary memory storage device of claim 1 wherein said dc magnetic field is about 30 Oe (2400 A/m).

3. A cryotron comprising a crystal of a compound having the formula $Bi_2Sr_{3-z}Ca_zCu_2O_{8+w}$ wherein z is from about 0.4 to about 0.8 and $o<w<1$, means for passing an electrical current through said crystal, means for cooling said crystal to a temperature between about 77K and about 96K, and means for applying and removing a dc magnetic field of about 10 Oe to about 200 Oe to said crystal.

4. The cryotron of claim 3 wherein said dc magnetic field is about 30 Oe.

* * * * *